(12) United States Patent
Kwon et al.

(10) Patent No.: US 12,538,660 B2
(45) Date of Patent: Jan. 27, 2026

(54) DISPLAY APPARATUS

(71) Applicant: Samsung Display Co., Ltd., Yongin-si (KR)

(72) Inventors: Ohjune Kwon, Yongin-si (KR); Jeongseok Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 491 days.

(21) Appl. No.: 17/974,198

(22) Filed: Oct. 26, 2022

(65) Prior Publication Data
US 2023/0209903 A1    Jun. 29, 2023

(30) Foreign Application Priority Data
Dec. 27, 2021    (KR) .................. 10-2021-0188862

(51) Int. Cl.
*H10K 59/122*    (2023.01)
*H10K 59/80*    (2023.01)
*H10K 71/00*    (2023.01)
*H10K 59/12*    (2023.01)

(52) U.S. Cl.
CPC ......... *H10K 59/122* (2023.02); *H10K 59/873* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 7,834,543 B2 | 11/2010 | Takata | |
| 8,415,872 B2 | 4/2013 | Choi et al. | |
| 9,627,637 B2 | 4/2017 | Kwon | |
| 10,680,046 B2 | 6/2020 | Moon et al. | |
| 10,727,439 B2 | 7/2020 | Lim | |
| 10,923,543 B1* | 2/2021 | Chen | H10K 71/00 |
| 2011/0241562 A1* | 10/2011 | Choi | H05B 45/60 |
| | | | 315/291 |
| 2018/0254429 A1* | 9/2018 | Lee | H10K 50/814 |
| 2022/0206618 A1* | 6/2022 | Lee | G06F 3/04164 |

FOREIGN PATENT DOCUMENTS

| | | |
|---|---|---|
| KR | 1020090004672 A | 1/2009 |
| KR | 1020110111746 A | 10/2011 |
| KR | 1020170080306 A | 7/2017 |
| KR | 1020190029178 A | 3/2019 |
| KR | 1020190066326 A | 6/2019 |
| KR | 1020210079071 A | 6/2021 |

* cited by examiner

*Primary Examiner* — Michelle Mandala
(74) *Attorney, Agent, or Firm* — CANTOR COLBURN LLP

(57) ABSTRACT

A display apparatus includes a substrate, a first electrode disposed on the substrate, a bank layer overlapping an edge of the first electrode and defining an opening in the bank layer which corresponds to the first electrode, a protrusion portion disposed on the bank layer and is spaced apart from the opening in the bank layer, the protrusion portion having a reverse-tapered structure in a cross-sectional view, an emission layer overlapping the first electrode through the opening, and a second electrode disposed on the emission layer and the protrusion portion, wherein a thickness of the second electrode decreases from a top surface of the protrusion portion toward a bottom surface of the protrusion portion on a side surface of the protrusion portion.

20 Claims, 14 Drawing Sheets

DISPLAY APPARATUS

This application claims priority to Korean Patent Application No. 10-2021-0188862, filed on Dec. 27, 2021, and all the benefits accruing therefrom under 35 U.S.C. § 119, the disclosure of which is incorporated by reference herein in its entirety.

BACKGROUND

1. Field

One or more embodiments relate to display apparatuses.

2. Description of the Related Art

As the information society has developed, the demand for display apparatuses for displaying images has increased in various forms. The field of display apparatuses has rapidly changed to thin, light, and large-area flat panel displays (FPDs) replacing bulky cathode ray tubes (CRTs). Examples of the flat panel displays include liquid crystal displays (LCDs), plasma display panels (PDPs), organic light emitting displays (OLEDs), and electrophoretic displays (EPDs).

Among the display apparatuses, an organic light emitting display apparatus may include an organic light emitting diode including an opposite electrode, a subpixel electrode and an emission layer together, as a display element. When a voltage is applied to the opposite electrode and the subpixel electrode of the organic light emitting diode, visible light may be extracted from the emission layer. The emission layer of the organic light emitting diode may be formed by discharging ink including a light emitting material onto the subpixel electrode.

SUMMARY

One or more embodiments include a display apparatus having a reduced dark point occurrence rate and an improved luminance. However, these problems are merely examples and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate, a first electrode on the substrate, a bank layer covering an edge of the first electrode and including an opening overlapping the first electrode, a protrusion portion on the bank layer and having a reverse-tapered structure in a cross-sectional view, an emission layer overlapping the first electrode through the opening, a second electrode on the emission layer and the protrusion portion, and a thin film encapsulation layer on the second electrode. A thickness of the second electrode decreases from a top surface of the protrusion portion toward a bottom surface of the protrusion portion, along a side surface of the protrusion portion.

In an embodiment, the thin film encapsulation layer may include a first inorganic encapsulation layer on the second electrode, a second inorganic encapsulation layer on the first inorganic encapsulation layer, and an organic encapsulation layer between the first inorganic encapsulation layer and the second inorganic encapsulation layer.

In an embodiment, the first inorganic encapsulation layer may include an opening overlapping the top surface of the protrusion portion.

In an embodiment, the second electrode may include an opening under the side surface of the protrusion portion.

In an embodiment, the second electrode may include an opening on a top surface of the bank layer adjacent to a bottom portion of the side surface of the protrusion portion.

In an embodiment, in the second electrode, an oxygen concentration of a portion covering the protrusion portion may be greater than an oxygen concentration of a portion covering the emission layer.

In an embodiment, the display apparatus may further include a sub protrusion portion on the bank layer, where the sub protrusion portion may have a smaller thickness than the protrusion portion.

In an embodiment, at least a portion of the sub protrusion portion may be between the protrusion portion and the opening of the bank layer.

In an embodiment, the sub protrusion portion may surround the protrusion portion in a plan view.

In an embodiment, the sub protrusion portion may surround the protrusion portion circularly in the plan view.

According to one or more embodiments, a display apparatus includes a substrate, a bank layer on the substrate and defining an emission area and a non-emission area, a light emitting device in the emission area and including a first electrode, an emission layer on the first electrode and a second electrode on the emission layer, a protrusion portion arranged in the non-emission area on the bank layer, and a thin film encapsulation layer covering the light emitting device and the protrusion portion. The protrusion portion has a shape increasing in width away from the substrate. The second electrode is on the protrusion portion and a thickness of a portion of the second electrode extended along a side surface of the protrusion portion decreases toward a bottom surface of the protrusion portion.

In an embodiment, the thin film encapsulation layer may include a first inorganic encapsulation layer on the second electrode, a second inorganic encapsulation layer on the first inorganic encapsulation layer, and an organic encapsulation layer between the first inorganic encapsulation layer and the second inorganic encapsulation layer.

In an embodiment, the first inorganic encapsulation layer may include an opening overlapping a top surface of the protrusion portion.

In an embodiment, the second electrode may define an opening which exposes a bottom portion of the side surface of the protrusion portion.

In an embodiment, the second electrode may define an opening on a top surface of the bank layer adjacent to a bottom portion of the side surface of the protrusion portion.

In an embodiment, in the second electrode, an oxygen concentration of a portion covering the protrusion portion may be greater than an oxygen concentration of a portion covering the emission layer.

In an embodiment, the display apparatus may further include a sub protrusion portion on the bank layer, wherein the sub protrusion portion may have a smaller thickness than the protrusion portion.

In an embodiment, at least a portion of the sub protrusion portion may be between the protrusion portion and an opening of the bank layer.

In an embodiment, the sub protrusion portion may surround the protrusion portion in a plan view.

In an embodiment, the sub protrusion portion may surround the protrusion portion circularly in the plan view.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
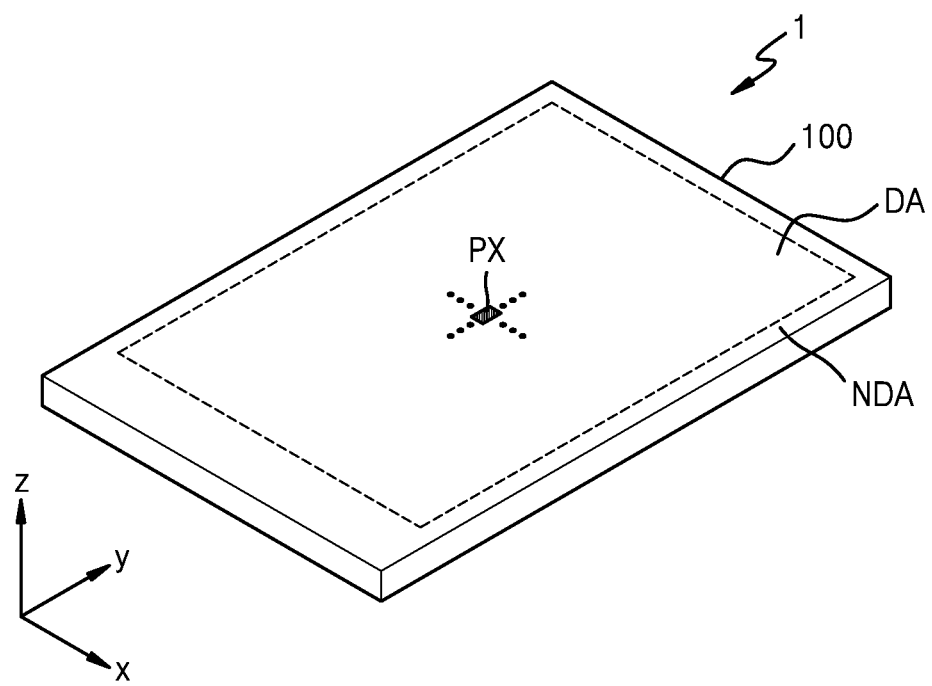
FIG. 1 is a perspective view schematically illustrating a display apparatus according to an embodiment.

Reference will now be made in detail to embodiments, examples of which are illustrated in the accompanying drawings. Like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

It will be understood that although terms such as "first" and "second" may be used herein to describe various elements, these elements should not be limited by these terms and these terms are only used to distinguish one element from another element.

The terminology used herein is for the purpose of describing particular embodiments only and is not intended to be limiting. As used herein, the singular forms "a," "an," and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, a reference number may indicate a singular element or a plurality of the element. For example, a reference number labeling a singular form of an element within the drawing figures may be used to reference a plurality of the singular element within the text of specification.

It will be understood that terms such as "comprise," "include," and "have" used herein specify the presence of stated features or elements, but do not preclude the presence or addition of one or more other features or elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be understood that when a layer, region, area, component, or element is referred to as being related to another element such as being "on" another layer, region, area, component, or element, it may be "directly on" the other layer, region, area, component, or element or may be "indirectly on" the other layer, region, area, component, or element with one or more intervening layers, regions, areas, components, or elements therebetween. In contrast, when a layer, region, area, component, or element is referred to as being related to another element such as being "directly on" another layer, region, area, component, or element, no intervening layer, region, area component, or element is present therebetween.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Sizes of elements in the drawings may be exaggerated for convenience of description. In other words, since the sizes and thicknesses of elements in the drawings are arbitrarily illustrated for convenience of description, the disclosure is not limited thereto.

As used herein, "A and/or B" represents the case of A, B, or A and B. Also, "at least one of A and B" represents the case of A, B, or A and B.

In the following embodiments, the meaning of a line "extending in a first direction or a second direction" may include not only extending in a linear shape but also extending in a zigzag or curved shape along the first direction or the second direction.

In the following embodiments, when referred to as "in a plan view," it may mean that a target portion is viewed from above, and when referred to as "in a cross-sectional view," it may mean that a cross-section of a target portion vertically cut is viewed from side. In the following embodiments, when referred to as "overlapping," it may include overlapping "in a plan view" and overlapping "in a cross-sectional view."

Hereinafter, embodiments will be described in detail with reference to the accompanying drawings, and in the following description, like reference numerals will denote like elements.

FIG. 1 is a perspective view schematically illustrating a display apparatus 1 according to an embodiment.

A display apparatus 1 may be an apparatus displaying an image. The display apparatus 1 may be a portable electronic apparatus such as a mobile phone, a smart phone, a tablet personal computer, a mobile communication terminal, an electronic notebook, an electronic book, a portable multimedia player (PMP), a navigation apparatus, or an ultra-mobile personal computer (UMPC). Also, the display apparatus 1 according to an embodiment may be used in wearable electronic apparatuses such as smart watches, watch phones, glasses-type displays, and head-mounted displays (HMDs). Also, the display apparatus 1 according to an embodiment may be used as a center information display (CID) arranged at a vehicle's instrument panel or a vehicle's center fascia or dashboard, a room mirror display replacing a vehicle's side mirror, or a display arranged at a rear side of a vehicle's front seat as an entertainment for a vehicle's rear seat.

Referring to FIG. 1, the display apparatus 1 may include a display area DA and a non-display area NDA which is adjacent to the display area DA. The display apparatus 1 and various layers and/or components thereof may include the display area DA and the non-display area NDA. For example, the display apparatus 1 may include a substrate 100 including the display area DA and the non-display area NDA. The display area DA may implement an image. A subpixel PX provided in plural including a plurality of subpixels PX may be arranged in the display area DA. An image may be provided by using light emitted from the subpixels PX.

The non-display area NDA may be an area (e.g., a planar area) that does not provide an image, and the subpixel PX is excluded from the non-display area NDA. The non-display area NDA may entirely surround the display area DA (e.g., may surround an entirety of the display area DA). A driver or the like which is connected to the subpixels PX for providing an electrical signal or power to the subpixels PX, may be arranged in the non-display area NDA. The non-display area NDA may include a pad portion (not illustrated) that is an area of the display apparatus 1 at which an electronic device, a printed circuit board, or the like may be electrically connected to the display apparatus 1.

Figure 2:
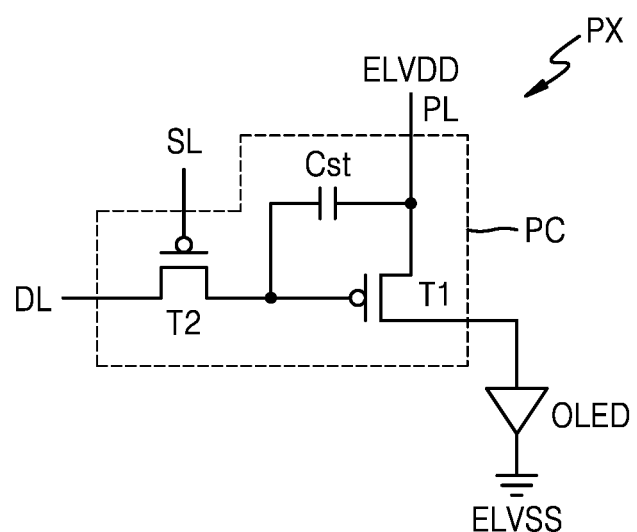
FIG. 2 is an equivalent circuit diagram of a subpixel included in a display apparatus according to an embodiment.

FIG. 2 is an equivalent circuit diagram of a subpixel PX included in a display apparatus 1 according to an embodiment.

Referring to FIG. 2, the subpixel PX may include a subpixel circuit PC and a display element, for example, an organic light emitting diode OLED which is connected to the subpixel circuit PC. Hereinafter, it will be described that the display element is an organic light emitting diode OLED including an organic light emitting material. However, the disclosure is not limited thereto. For example, the display element may be an inorganic light emitting diode including an inorganic material. The inorganic light emitting diode may include a PN junction diode including inorganic semiconductor-based materials. When a voltage is applied to the PN junction diode in a forward direction, holes and electrons may be injected thereinto and energy generated by recombination of the holes and electrons may be converted into light energy to emit light of a certain color. The inorganic light emitting diode may have a width of several to several hundred micrometers or several to several hundred nanometers. In embodiments, the light emitting diode corresponding to the display element may include a quantum dot light emitting diode. As described above, an emission layer of the display element may include an organic material, may include an inorganic material, may include quantum dots, may include an organic material and quantum dots, or may include an inorganic material and quantum dots. Hereinafter, for convenience of description, a case where the display element includes an organic light emitting diode will be described.

The subpixel circuit PC may include a first thin film transistor T1, a second thin film transistor T2, and a storage capacitor Cst. Each subpixel PX may emit, for example, red, green, or blue light or red, green, blue, or white light from the organic light emitting diode OLED.

As a switching thin film transistor, the second thin film transistor T2 may be connected to signal lines such as a scan line SL and a data line DL and may be configured to transmit a data voltage or a data signal as an electrical signal input from the data line DL to the first thin film transistor T1 according to a switching voltage or a switching signal as another electrical signal input from the scan line SL. The storage capacitor Cst may be connected to the second thin film transistor T2 and a driving voltage line PL and may be configured to store a voltage corresponding to the difference between a voltage received from the second thin film transistor T2 and a first power voltage ELVDD supplied to the driving voltage line PL.

As a driving thin film transistor, the first thin film transistor T1 may be connected to the driving voltage line PL and the storage capacitor Cst and may be configured to control a driving current (e.g., electrical driving current) flowing from the driving voltage line PL through the organic light emitting diode OLED in response to a voltage value stored in the storage capacitor Cst. The organic light emitting diode OLED may emit light with a certain brightness according to the driving current. An opposite electrode (e.g., a cathode) of the organic light emitting diode OLED may be supplied with a second power voltage ELVSS.

FIG. 2 illustrates that the subpixel circuit PC includes two thin film transistors and one storage capacitor, however, is not limited thereto. In embodiments, the number of thin film transistors and the number of storage capacitors may be variously modified according to the design of the subpixel circuit PC.

Figure 3:
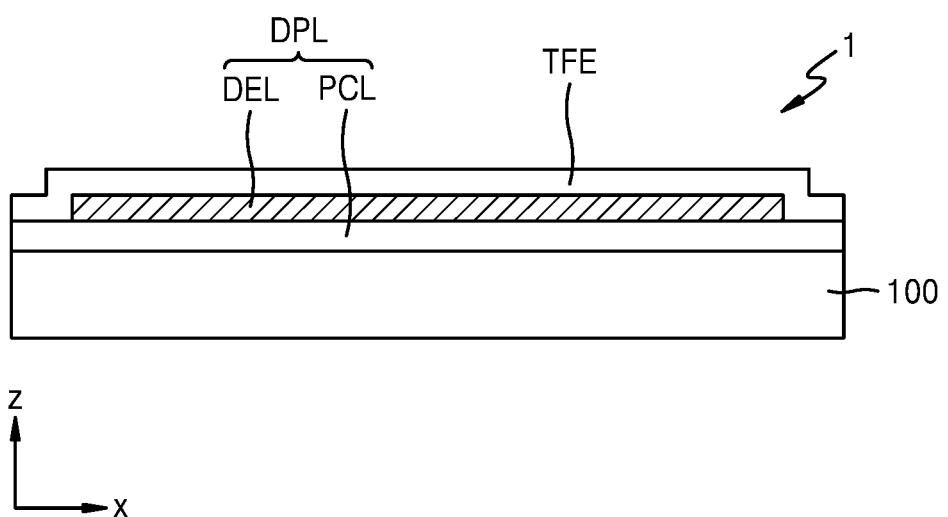
FIG. 3 is a cross-sectional view schematically illustrating a portion of a display apparatus according to an embodiment.

FIG. 3 is a cross-sectional view schematically illustrating a display apparatus 1 according to an embodiment.

Referring to FIG. 3, the display apparatus 1 according to an embodiment may include a substrate 100, a display layer DPL disposed on the substrate 100, and a thin film encapsulation layer TFE (e.g., an encapsulation layer) disposed thereon, in order.

The substrate 100 may include glass or polymer resin. For example, the polymer resin may include polyether sulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multilayer structure including an inorganic layer (not illustrated) and a layer including the polymer resin.

A barrier layer (not illustrated) may be further included between the substrate 100 and a subpixel circuit layer PCL. The barrier layer may be a layer preventing the penetration of foreign substances and may have a single-layer or multiple-layer structure including an inorganic material such as silicon nitride or silicon oxide.

The display layer DPL may include the subpixel circuit layer PCL including a subpixel circuit and insulating layers, and a display element layer DEL including a plurality of display elements on the subpixel circuit layer PCL.

The display element layer DEL may include display elements, for example, organic light emitting diodes OLED. The subpixel circuit layer PCL may include insulating layers and a subpixel circuit which is electrically connected to the organic light emitting diodes OLED. For example, the subpixel circuit layer PCL may include a plurality of thin film transistors, capacitors, and insulating layers located therebetween.

The thin film encapsulation layer TFE may be disposed on the display layer DPL. For example, the display layer DPL may be encapsulated by the thin film encapsulation layer TFE. The thin film encapsulation layer TFE may include at least one inorganic encapsulation layer and at least one organic encapsulation layer.

In embodiments, the display apparatus 1 may further include an encapsulation substrate (not illustrated) including a glass material, together with the thin film encapsulation layer TFE. The encapsulation substrate may be disposed on the display layer DPL, and the display layer DPL may be located between the substrate 100 and the encapsulation substrate. A gap may exist between the encapsulation substrate and the display layer DPL, and the gap may be filled with a filler.

Although not illustrated in FIG. 3, a touch electrode layer (not illustrated) may be disposed on the thin film encapsulation layer TFE, and an optical functional layer (not illustrated) may be disposed on the touch electrode layer.

The touch electrode layer may be configured to sense an external input, for example, a contact, a pressure, a proximity, a light, etc. from an input tool such as a body part like a finger or a stylus pen, such that the display apparatus 1 may obtain coordinate information corresponding to a touch position or input position. The touch electrode layer may include a touch electrode and trace lines which are connected to the touch electrode. The touch electrode layer may be configured to sense an external input by a mutual capacitance method or a self-capacitance method.

In an embodiment, the touch electrode layer may be directly formed on the thin film encapsulation layer TFE. As being directly on each other, elements may contact each other, form an interface therebetween, etc. without being limited thereto. Alternatively, the touch electrode layer may be separately formed and then adhered onto the thin film encapsulation layer TFE by using an adhesive member. The adhesive member may include a general adhesive known in the art, without limitation. The adhesive member may be, for example, an optically clear adhesive (OCA).

The optical functional layer may reduce the reflectance of light (external light) incident from outside of the display apparatus 1 and toward the display apparatus 1, and may improve the color purity of light emitted from the display apparatus 1. In an embodiment, the optical functional layer may include a phase retarder and/or a polarizer. The phase retarder may be a film type or a liquid crystal coating type and may include a $\lambda/2$ phase retarder and/or a $\lambda/4$ phase retarder. Also, the polarizer may be a film type or a liquid crystal coating type. The film-type polarizer may include a stretchable synthetic resin film, and the liquid crystal coating-type polarizer may include liquid crystals arranged in a certain arrangement.

In an embodiment, the optical functional layer may include a destructive interference structure. The destructive interference structure may include a first reflection layer and a second reflection layer disposed on different layers. First reflected light and second reflected light respectively reflected by the first reflection layer and the second reflection layer may destructively interfere with each other, and accordingly, the external light reflectance may be reduced.

Figure 4:
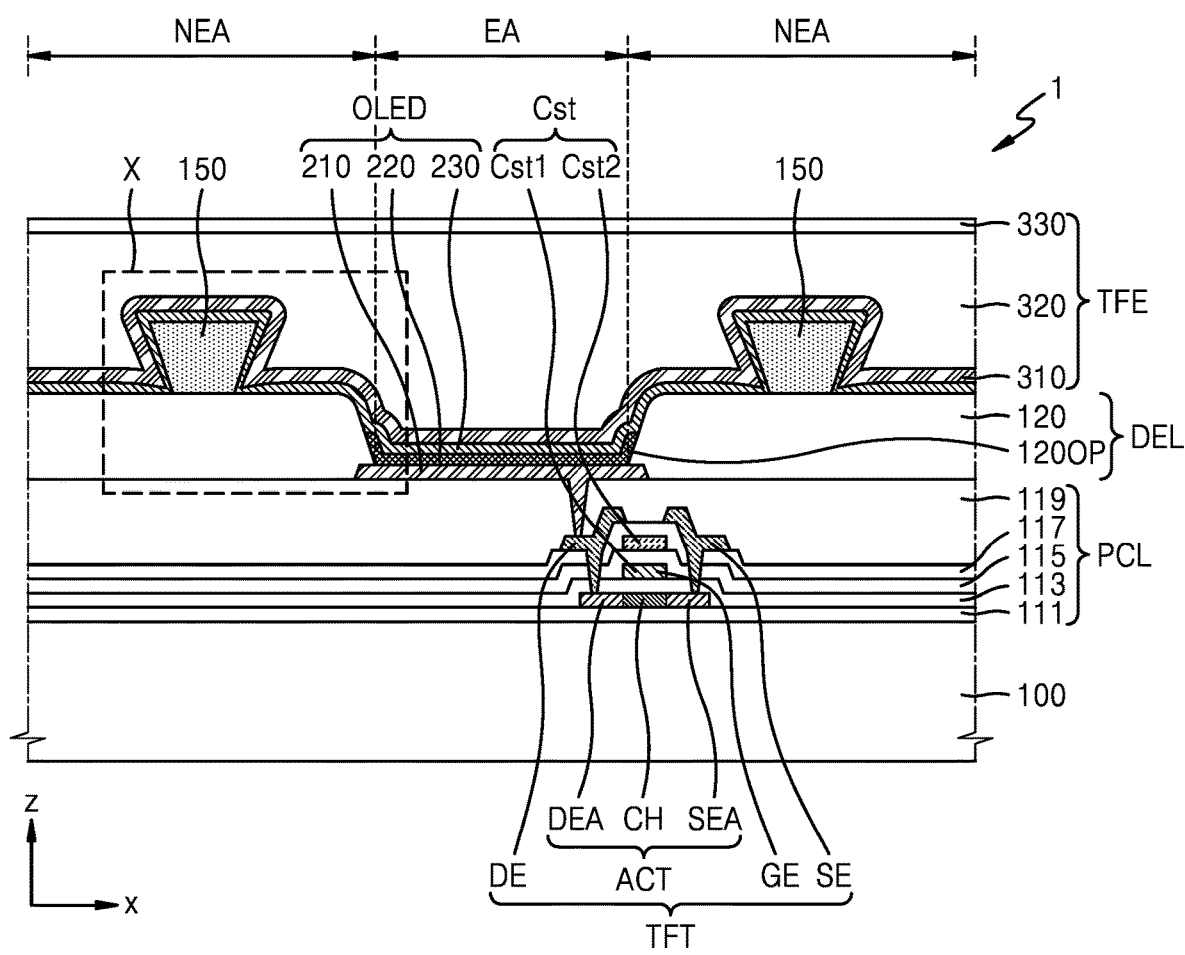
FIG. 4 is a cross-sectional view schematically illustrating a subpixel of a display apparatus according to an embodiment.
Figure 5:
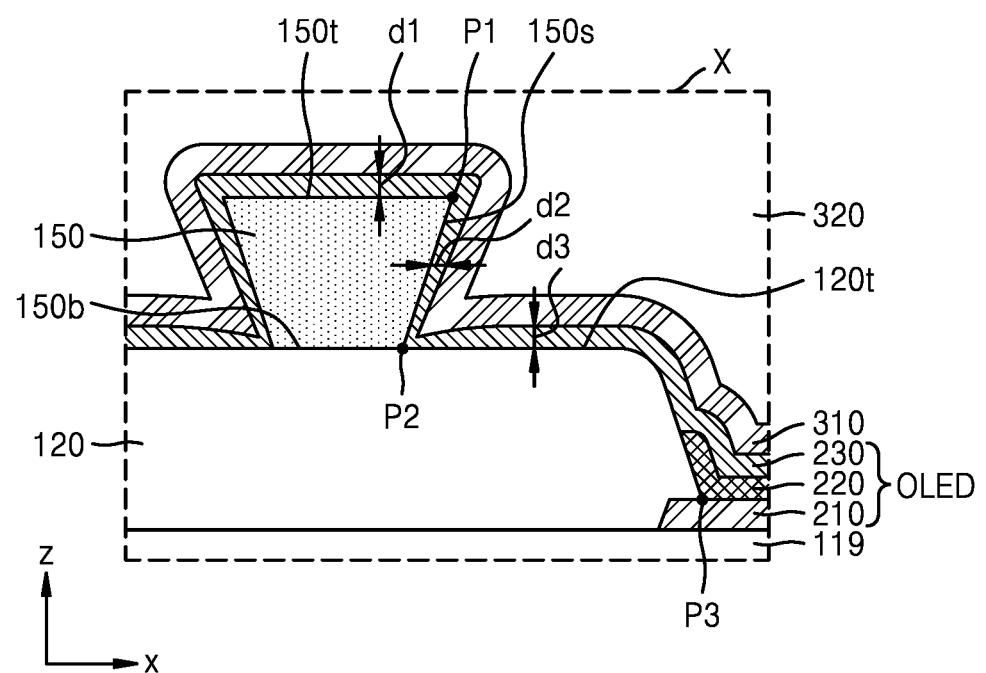
FIG. 5 is an enlarged view of region X of FIG. 4.

FIG. 4 is a cross-sectional view schematically illustrating a pixel of a display apparatus according to an embodiment, and FIG. 5 is an enlarged cross-sectional view of region X of FIG. 4.

Referring to FIG. 4, the display apparatus 1 may include a substrate 100, a subpixel circuit layer PCL, and a display element layer DEL on the subpixel circuit layer PCL.

The subpixel circuit layer PCL may include at least one thin film transistor TFT. The display element layer DEL may include a bank layer 120 and an organic light emitting diode OLED as a display element. The organic light emitting diode OLED may include a first electrode 210, an emission layer 220, and a second electrode 230 facing the first electrode 210 with the emission layer 220 therebetween.

The subpixel circuit layer PCL may include a thin film transistor TFT, a buffer layer 111 as an insulating layer, a first gate insulating layer 113, a second gate insulating layer 115, an interlayer insulating layer 117, and a planarization layer 119.

The buffer layer 111 may be located on the substrate 100 to reduce or block the penetration of foreign materials, moisture, or external air from under the substrate 100 to a layer above the buffer layer 111, and may provide a flat surface on the substrate 100. The buffer layer 111 may include an inorganic insulating material such as silicon nitride, silicon oxynitride, and silicon oxide and may include a single layer or multiple layers including the inorganic insulating material.

The thin film transistor TFT may be disposed on the buffer layer 111. The thin film transistor TFT may include a semiconductor layer ACT, a gate electrode GE, a source electrode SE, and a drain electrode DE. The thin film transistor TFT may be connected to the organic light emitting diode OLED to drive and/or control the organic light emitting diode OLED to emit light, display an image, etc.

The semiconductor layer ACT may be disposed on the buffer layer 111. The semiconductor layer ACT may include polysilicon or amorphous silicon. Alternatively, the semiconductor layer ACT may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer ACT may include (or define) a channel area CH, and a source area SEA and a drain area DEA which are respectively arranged on both sides of the channel area CH (e.g., opposing sides of the channel area CH).

The gate electrode GE may overlap the channel area CH. The gate electrode GE may include a low-resistance metal material. The gate electrode GE may include a conductive material including molybdenum (Mo), aluminum (Al), copper (Cu), titanium (Ti), or the like and may include a single layer or multiple layers including the above material.

The first gate insulating layer 113 between the semiconductor layer ACT and the gate electrode GE may include an inorganic insulating material such as silicon oxide, silicon nitride, silicon oxynitride, aluminum oxide, titanium oxide, tantalum oxide, hafnium oxide, or zinc oxide.

The second gate insulating layer 115 may be provided to cover the gate electrode GE. Like the first gate insulating layer 113, the second gate insulating layer 115 may include an inorganic insulating material such as silicon oxide, silicon nitride, silicon oxynitride, aluminum oxide, titanium oxide, tantalum oxide, hafnium oxide, or zinc oxide.

An upper electrode Cst2 of a storage capacitor Cst may be disposed over the second gate insulating layer 115. The upper electrode Cst2 may overlap (or correspond to) the gate electrode GE thereunder, along a thickness direction of the display apparatus 1. The gate electrode GE and the upper electrode Cst2 overlapping each other with the second gate insulating layer 115 therebetween may form the storage capacitor Cst. That is, the gate electrode GE may function as a lower electrode Cst1 of the storage capacitor Cst.

As such, the storage capacitor Cst and the thin film transistor TFT may be disposed to overlap each other. In embodiments, the storage capacitor Cst may be disposed not to overlap the thin film transistor TFT.

The upper electrodes Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may have a single-layer or multiple-layer structure of the above material.

The interlayer insulating layer 117 may cover the upper electrode Cst2. The interlayer insulating layer 117 may include silicon oxide, silicon nitride, silicon oxynitride, aluminum oxide, titanium oxide, tantalum oxide, hafnium oxide, or zinc oxide. The interlayer insulating layer 117 may have a single-layer or multiple-layer structure including the above inorganic insulating material.

Each of the drain electrode DE and the source electrode SE may be located on the interlayer insulating layer 117. The drain electrode DE and the source electrode SE may be respectively connected to the drain area DEA and the source are a SEA through contact holes included in the first gate insulating layer 113, the second gate insulating layer 115, and the interlayer insulating layer 117. The drain electrode DE and the source electrode SE may include a material having high conductivity. The drain electrode DE and the source electrode SE may include a conductive material including molybdenum (Mo), aluminum (Al), copper (Cu), titanium (Ti), or the like and may include a single layer or multiple layers including the above material. In an embodiment, the drain electrode DE and the source electrode SE may have a multilayer structure of Ti/Al/Ti.

The planarization layer 119 may cover the thin film transistor TFT and may include a contact hole exposing a portion of the thin film transistor TFT. In order to provide a flat top surface, chemical mechanical polishing may be performed on the top surface of the planarization layer 119 after the planarization layer 119 is formed (or provided). The planarization layer 119 may include an organic insulating material such as a general-purpose polymer such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any blend thereof. FIG. 4 illustrates that the planarization layer 119 includes a single layer, however, is not limited thereto. In embodiments, the planarization layer 119 may include multiple layers.

The first electrode 210 of the organic light emitting diode OLED may be directly connected to the thin film transistor TFT through the contact hole of the planarization layer 119. The first electrode 210 may be disposed on the planarization layer 119. The first electrode 210 may be arranged in each subpixel PX, such as to define a plurality of discrete patterns of the first electrode 210 including a plurality of first electrodes 210. The first electrodes 210 respectively corresponding to adjacent subpixels PX among the plurality of subpixels PX, may be arranged apart from each other (e.g., spaced apart from each other with a gap therebetween).

The first electrode 210 may be a reflective electrode. The first electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof, and a transparent or semitransparent conductive layer formed on the reflective layer. The transparent or semitransparent conductive layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The bank layer 120 may be disposed on the first electrode 210. The bank layer 120 may cover the edge of the first electrode 210. The bank layer 120 may prevent an arc (e.g., electrical arc) from occurring at the edge of the first electrode 210, by increasing a distance between the edge of the first electrode 210 and the second electrode 230. The bank layer 120 may include (or define) a first opening 120OP overlapping the first electrode 210. The first opening 120OP of the bank layer 120 may expose at least a portion of the first electrode 210. The first opening 120OP may define an emission area EA (e.g., light emission area) at which light emitted from the organic light emitting diode OLED. For example, in a direction along the substrate 100, a width of the first opening 120OP may correspond to a width of the emission area EA. In this case, the width of the first opening 120OP may be defined as the shortest distance between inner surfaces of the bank layer 120 which define the first opening 120OP. An area in which the bank layer 120 is formed may correspond to a non-emission area NEA (e.g., non-light emission area). The non-emission area NEA may include a solid portion of the bank layer 120, and solid portions of the bank layer 120 may be spaced apart from each other to define one or more of the first opening 120OP.

The bank layer 120 may include an organic insulating material. Alternatively, the bank layer 120 may include an inorganic insulating material such as silicon nitride or silicon oxide. In some embodiments, the bank layer 120 may include an organic insulating material and an inorganic insulating material.

The bank layer 120 may include a light blocking material. For example, the light blocking material of the bank layer 120 may be black. The light blocking material may include a resin or paste including carbon black, carbon nanotube, or black dye, metal particles (e.g., nickel, aluminum, molybdenum, or any alloy thereof), metal oxide particles, or metal nitride particles. When the bank layer 120 includes the light blocking material, the reflection of external light by metal or reflective structures disposed under the bank layer 120 may be reduced. However, the disclosure is not limited thereto. In an embodiment, the bank layer 120 may include a transparent organic insulating material instead of including the light blocking material.

Referring to FIGS. 4 and 5, a protrusion portion 150 may be arranged in the non-emission area NEA on the bank layer 120. The protrusion portion 150 may separate a mask FM used for depositing emission layer material for forming the emission layer 220 of the organic light emitting diode OLED, from remaining layers or patterns (such as other structures of the organic light emitting diode OLED) to prevent damage due to the mask.

The protrusion portion 150 may have a shape in cross-section which increases in width (or cross-sectional area) in a direction away from the substrate 100 (e.g., toward the z direction). The width (or cross-sectional area) of a top surface 150t of the protrusion portion 150 which is furthest from the substrate 100, may be greater than the width (or cross-sectional area) of a bottom surface 150b thereof which is closest to the substrate 100. In other words, the protrusion portion 150 may have a reverse-tapered shape in the cross-sectional view. For example, as illustrated in FIGS. 4 and 5, the cross-section of the protrusion portion 150 may have an inverted trapezoidal shape. A side surface 150s connecting the top surface 150t and the bottom surface 150b of the protrusion portion 150 to each other, may include a reverse-tapered inclined surface.

The protrusion portion 150 may have at least one of a circular shape, an elliptical shape, a polygonal shape, a linear shape, and a curved linear shape in a top plan view. For example, in an embodiment, the protrusion portion 150 may be circular in the plan view.

The protrusion portion 150 may include an organic material. The protrusion portion 150 may include photoresist, that is, photosensitive resin. Particularly, the protrusion portion 150 may include negative-type photoresist. In an embodiment, the protrusion portion 150 may include a different material than the bank layer 120 and may be formed in a separate process from the bank layer 120.

The emission layer 220 may be disposed on the first electrode 210 and extend along an inner surface of the bank layer 120 which defines the first opening 120OP. The emission layer 220 may be arranged in the first opening 120OP of the bank layer 120. The emission layer 220 may include an organic material including a fluorescent or phosphorescent material capable of emitting blue, green, or red light. The above organic material layer may include a low-molecular weight organic material or a high-molecular weight organic material.

Although not illustrated in FIG. 4, a first functional layer and a second functional layer may be respectively disposed under and over the emission layer 220. For example, the first functional layer may include a hole transport layer (HTL) and/or a hole injection layer (HIL). The second functional layer may be disposed on the emission layer 220. The second functional layer may include an electron transport layer (ETL) and/or an electron injection layer (EIL). Like the second electrode 230 described below, the first functional layer and/or the second functional layer may be a common layer formed to entirely cover the substrate 100 (e.g., provided on an entirety of the substrate 100). In an embodiment, the second functional layer may be omitted.

The second electrode 230 may be disposed on the entire surface of the substrate 100 to cover the emission layer 220, the bank layer 120, and the protrusion portion 150. The second electrode 230 may be a cathode that is an electron injection electrode. The second electrode 230 may include a conductive material having a low work function. For example, the second electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the second electrode 230 may further include a layer such as ITO, IZO, ZnO, or $In_2O_3$ on the (semi)transparent layer including the above material. In an embodiment, the second electrode 230 may include a material vulnerable to oxidation. For example, the second electrode 230 may include magnesium (Mg).

Due to the shape of the protrusion portion 150, the second electrode 230 may be arranged to have different thicknesses on the top surface 150t and on the side surface 150s of the protrusion portion 150, and on the bank layer 120 around the protrusion portion 150 (e.g., adjacent to the protrusion portion 150). A first point P1 may correspond to a point where the top surface 150t and the side surface 150s of the protrusion portion 150 meet each other, a second point P2 may correspond to a point where the side surface 150s of the protrusion portion 150 and the bottom surface 150b of the protrusion portion 150 (or a top surface 120t of the bank layer 120) meet each other, and a third point P3 may correspond to a point where the top surface 120t of the bank layer 120 and the edge (e.g., outer edge) of the first electrode 210 meet each other.

The thicknesses of the second electrode 230 on the top surface 150t and on the side surface 150s of the protrusion portion 150 may be different from each other due to the reverse-tapered shape of the protrusion portion 150. A portion of the second electrode 230 disposed on the top surface 150t of the protrusion portion 150 may have a generally uniform thickness at points along the top surface 150t. In contrast, a thickness of a portion of the second electrode 230 disposed extended from the side surface 150s of the protrusion portion 150 may decrease in a direction from the top surface 150t toward the bottom surface 150b of the protrusion portion 150. Also, a portion of the second electrode 230 disposed extended from the bank layer 120 which is around the protrusion portion 150 and spaced apart from the second point P2, may have a generally uniform thickness. In this case, a portion of the second electrode 230 which is closest to the second point P2 among the portions of the second electrode 230 disposed on the bank layer 120 around the protrusion portion 150, may decrease in thickness.

A first thickness d1 of a portion of the second electrode 230 disposed on the top surface 150t of the protrusion portion 150 may be equal to or greater than a second thickness d2 of a portion of the second electrode 230 disposed on the side surface 150s of the protrusion portion 150. Particularly, among second thicknesses taken along the side surface 150s, a second thickness d2 of a portion of the second electrode 230 close to the first point P1 among the portions of the second electrode 230 disposed on the side surface 150s of the protrusion portion 150, may be similar to the first thickness d1 of a portion disposed on the top surface 150t of the protrusion portion 150. In contrast, among second thicknesses taken along the side surface 150s, the second thickness d2 of a portion closer to the second point P2 among the portions of the second electrode 230 disposed on the side surface 150s of the protrusion portion 150, may be less than the first thickness d1 of a portion disposed on the top surface 150t of the protrusion portion 150.

Also, a third thickness d3 of a portion of the second electrode 230 disposed on the bank layer 120 around the protrusion portion 150 and spaced apart from the second point P2, may be equal or similar to the first thickness d1 of a portion disposed on the top surface 150t of the protrusion portion 150. In an embodiment, the thickness of the second electrode 230 may be minimal at the second point P2, without being limited thereto. The thickness of the second electrode 230 may both decrease (e.g., from the top surface 150t to the bottom surface 150b at the second point P2) and increase (e.g., from the bottom surface 150b and in a direction toward the first opening 120OP).

As described below in detail, the second electrode 230 may include a metal vulnerable to oxidation and thus may be oxidized by the introduction of a gas including moisture and/or oxygen. As described above, the second electrode 230 may be disposed on the side surface 150s of the protrusion portion 150 and have a thickness which decreases in a direction toward the bottom surface 150b of the protrusion portion 150 (e.g., in a direction toward the bank layer 120). Accordingly, the propagation of the oxidation due to the penetration of an internal or external gas generated at a portion of the second electrode 230 which is disposed over the protrusion portion 150, to the vicinity of the subpixel PX, may be minimized or prevented.

In a comparative example of the disclosure, when a comparative protrusion portion having a forward-tapered shape having a gentle slope is formed over a bank layer, a comparative second electrode disposed over or around the comparative protrusion portion may be formed to have a generally uniform thickness. In this case, when a portion of the comparative second electrode disposed over the comparative protrusion portion is oxidized by the penetration of an internal or external gas, the oxidation may propagate equally in all directions having a uniform thickness from the point where oxidation started. Thus, the propagation of the oxidation may be facilitated from the portion of the comparative second electrode overlapping the comparative protrusion portion to a portion of the comparative second electrode overlapping an emission layer. When the oxidation propagates to a portion of the comparative second electrode disposed at the edge of a subpixel, the electrical resistance of the corresponding portion may increase and electrical current distribution may become non uniform and thus, subpixel shrinkage may occur. A light emission defect of the subpixel, for example, a dark point, may occur, and the luminance thereof may be reduced.

On the other hand, according to one or more embodiment, the protrusion portion 150 having a reverse-tapered shape in the cross-sectional view may be included, and a portion of the second electrode 230 disposed on the side surface 150s of the protrusion portion 150 may decrease in thickness in a direction toward the bottom surface 150b thereof. That is, a thickness of the second electrode 230 decreases in a direction from the top surface 150t of the protrusion portion 150 and away from the top surface 150t of the protrusion portion 150. In this case, even when a portion of the second electrode 230 disposed on the protrusion portion 150 is oxidized by the penetration of an internal or external gas, oxidation may be promoted to a portion disposed on the top surface 150t of the protrusion portion 150 having a relatively great thickness. Accordingly, the propagation of oxidation to a portion disposed on a bottom portion of the side surface 150s of the protrusion portion 150, which decreases relatively in thickness, may be minimized or prevented. Oxidation may be prevented or minimized to a portion of the second electrode 230 disposed at the third point P3 through the second point P2 of the protrusion portion 150. Thus, the occurrence of subpixel shrinkage due to oxidation may be reduced. The dark point occurrence rate may be reduced and the luminance may be improved.

The display layer DPL may further include a capping layer (not illustrated) disposed on the display element layer DEL. In an embodiment, the capping layer may be disposed on the organic light emitting diode OLED. The capping layer may function to improve the light emission efficiency of the organic light emitting diode OLED according to the principle of constructive interference. For example, the capping layer may include LiF and may be formed by thermal evaporation. In embodiments, the capping layer may be omitted.

A thin film encapsulation layer TFE may be disposed on the display layer DPL. The thin film encapsulation layer TFE may include a first inorganic encapsulation layer 310, a second inorganic encapsulation layer 330 thereover, and an organic encapsulation layer 320 located between the first inorganic encapsulation layer 310 and the second inorganic encapsulation layer 330.

The first inorganic encapsulation layer 310 and the second inorganic encapsulation layer 330 may include an inorganic insulating material such as silicon oxide, silicon nitride, silicon oxynitride, aluminum oxide, titanium oxide, tantalum oxide, hafnium oxide, or zinc oxide. The first inorganic encapsulation layer 310 and the second inorganic encapsulation layer 330 may have a single-layer or multiple-layer structure including the above inorganic insulating material.

The organic encapsulation layer 320 may relieve the internal stress of the first inorganic encapsulation layer 310 and/or the second inorganic encapsulation layer 330. The organic encapsulation layer 320 may include a polymer-based material. For example, the organic encapsulation layer 320 may include polyethyleneterephthalate, polyethylenenaphthalate, polycarbonate, polyimide, polyethylenesulfonate, polyoxymethylene, polyarylate, hexamethyldisiloxane, acrylic resin (e.g., polymethylmethacrylate or polyacrylic acid), or any combination thereof.

As illustrated in FIG. 4, when the thin film encapsulation layer TFE has a multilayer structure including the first inorganic encapsulation layer 310, the organic encapsulation layer 320, and the second inorganic encapsulation layer 330, even when a crack occurs in the thin film encapsulation layer TFE, the crack may not propagate between the first inorganic encapsulation layer 310 and the organic encapsulation layer 320 or between the organic encapsulation layer 320 and the second inorganic encapsulation layer 330. The thin film encapsulation layer TFE may prevent or minimize the penetration of external moisture or oxygen into the display area DA.

Figure 6A:
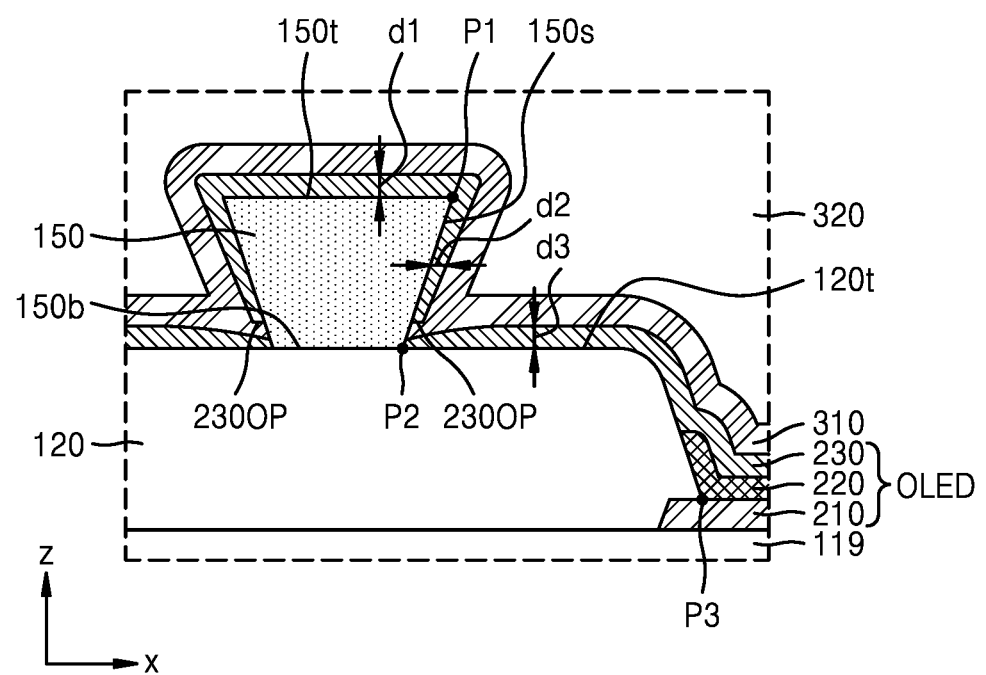
FIGS. 6A and 6B are each a cross-sectional view schematically illustrating a portion of a display apparatus according to an embodiment.
Figure 6B:
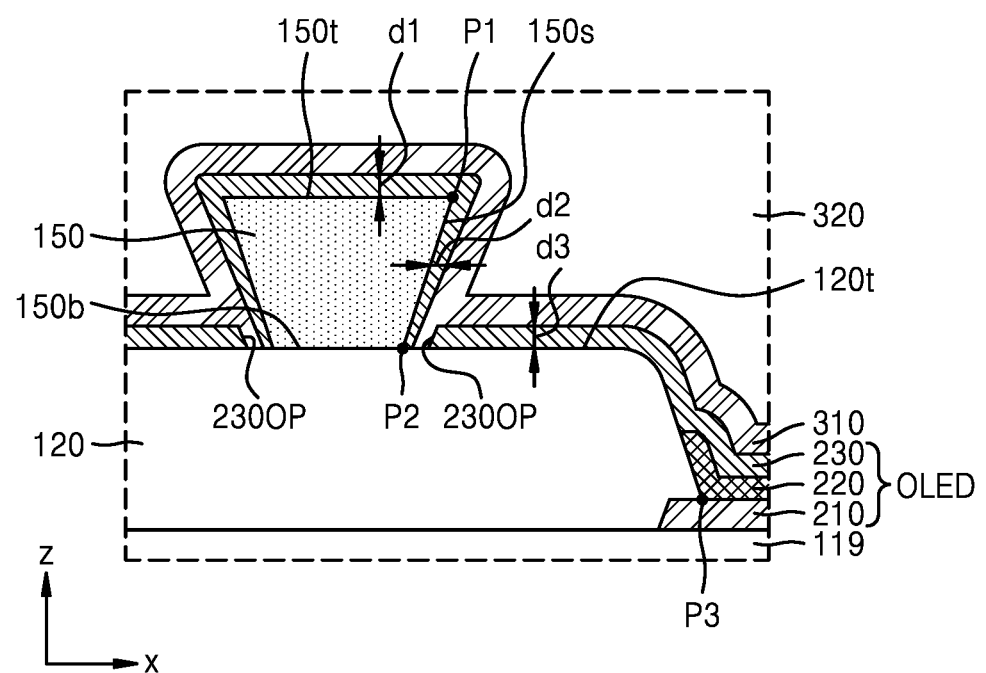

FIGS. 6A and 6B are each a cross-sectional view schematically illustrating a portion of a display apparatus 1 according to an embodiment.

Referring to FIGS. 6A and 6B, the second electrode 230 may be divided around the second point P2. In other words, the second electrode 230 may include (or define) a second opening 230OP located at or around the second point P2. With the second opening 230OP as the center, the second electrode 230 may include a portion located extend along the top surface 150t and the side surface 150s of the protrusion portion 150, and a portion located on the top surface 120t of the bank layer 120 in a direction away from the second opening 230OP and toward the first opening 120OP. These portions may be discontinuous by the second opening 230OP. As described above, due to the shape of the protrusion portion 150, a portion of the second electrode 230 which is adjacent to the second point P2 of the protrusion portion 150 may have a relatively small thickness as compared to remaining portions of the second electrode 230. In an embodiment, the second electrode 230 may include at least one second opening 230OP located around the second point P2.

As illustrated in FIG. 6A, the second opening 230OP of the second electrode 230 may be disposed on the bottom portion of the side surface 150s of the protrusion portion 150 and may overlap a portion of the side surface 150s of the protrusion portion 150. Alternatively, as illustrated in FIG. 6B, the second opening 230OP of the second electrode 230 may be disposed on the top surface 120t of the bank layer 120 adjacent to a bottom portion of the side surface 150s of the protrusion portion 150 and may overlap a portion of the top surface 120t of the bank layer 120. That is, the bank layer 120 may be exposed to outside the second electrode 230 at the second opening 230OP.

The second opening 230OP of the second electrode 230 may extend along the bottom portion of the side surface 150s of the protrusion portion 150. The second opening 230OP of the second electrode 230 may be formed to at least partially surround the protrusion portion 150 along the bottom portion of the side surface 150s of the protrusion portion 150. As an example, in the plan view, the second opening 230OP of the second electrode 230 may be an opening having a closed-loop shape in a plan view, and completely surrounding the bottom portion of the side surface 150s of the protrusion portion 150.

Since the second opening 230OP may function as a barrier for preventing the movement of a gas causing oxidation or the propagation of oxidation to a portion of the second electrode 230 disposed at the third point P3, through a portion of the second electrode 230 disposed at the second point P2, the occurrence of subpixel shrinkage may be reduced.

Figure 7A:
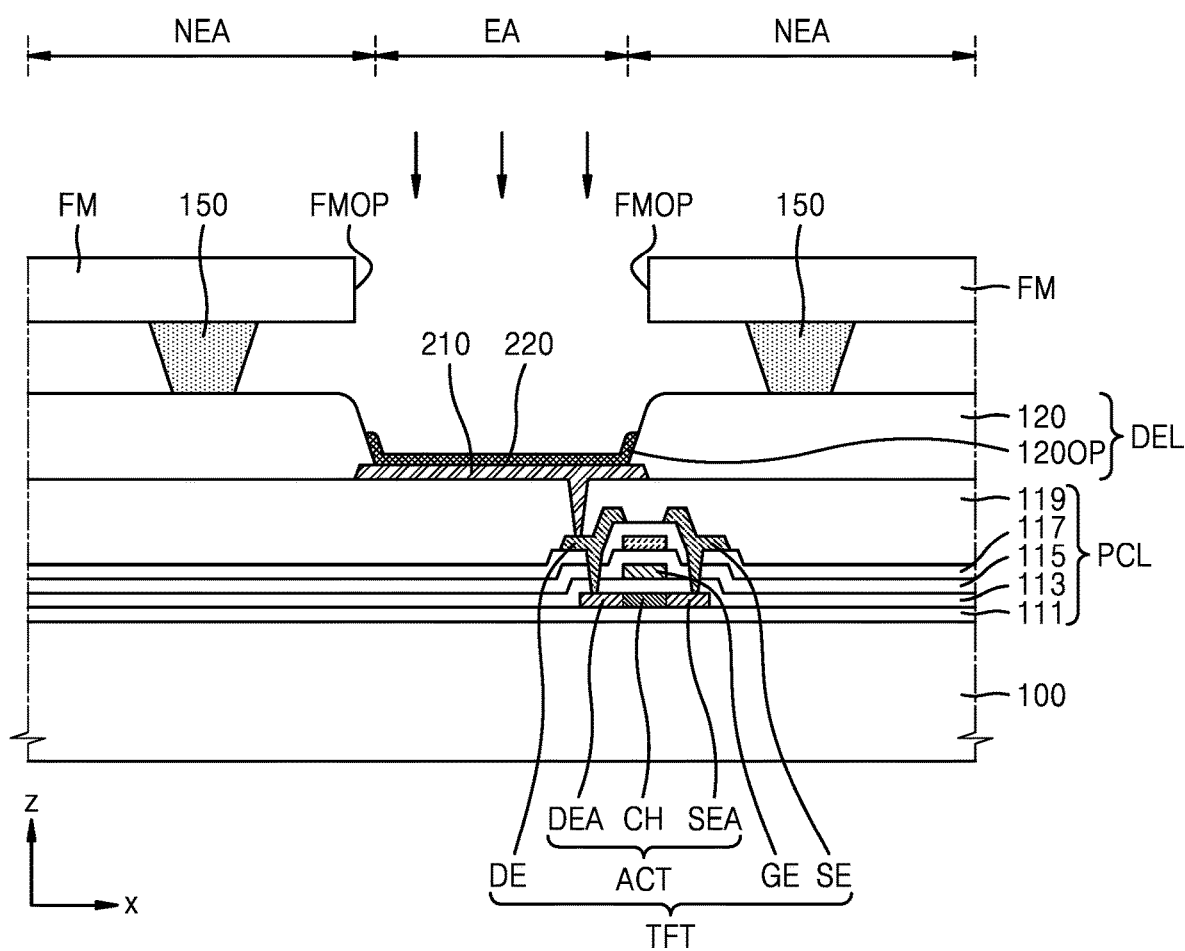
FIGS. 7A, 7B, and 7D are cross-sectional views sequentially illustrating a method of manufacturing a display apparatus according to an embodiment.
Figure 7B:
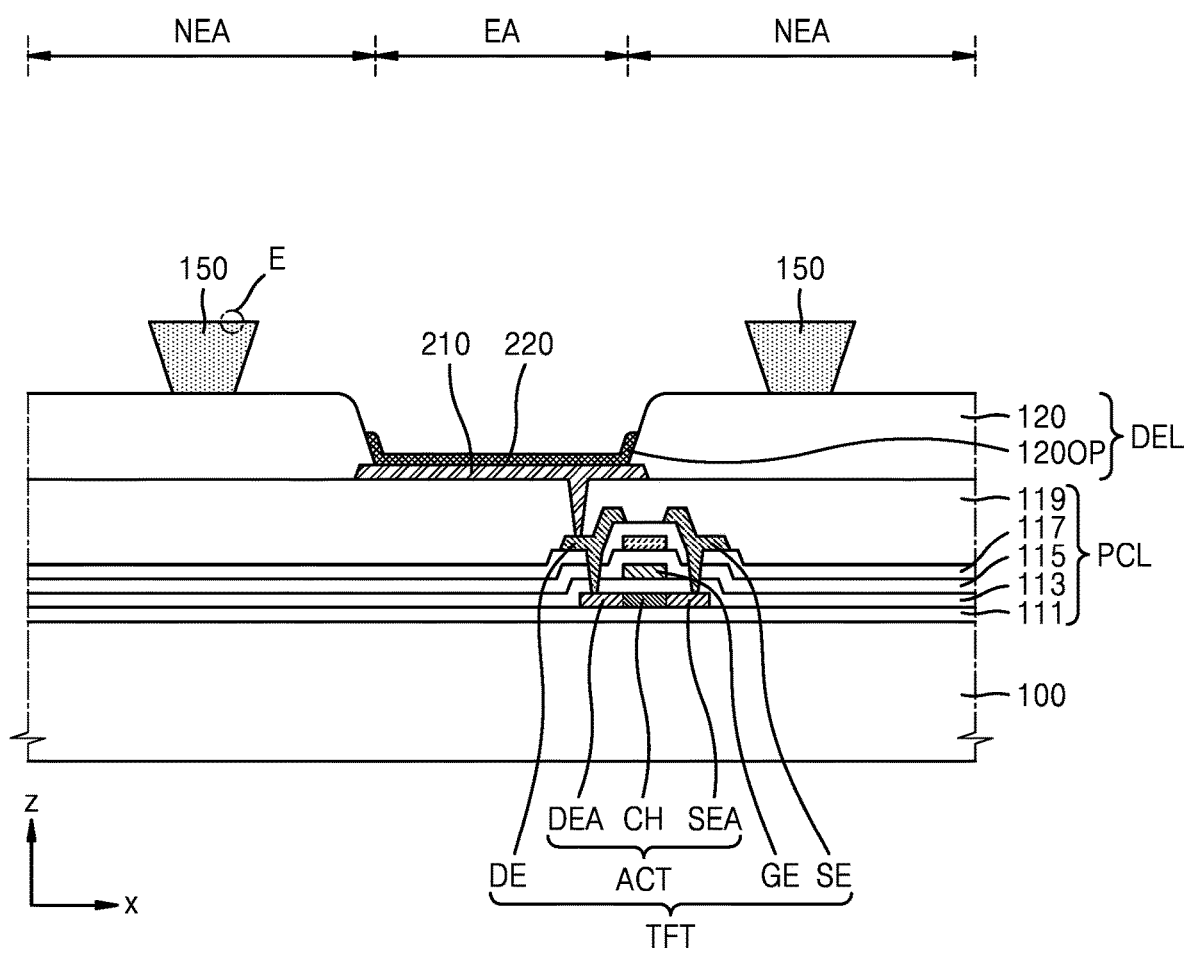
Figure 7C:
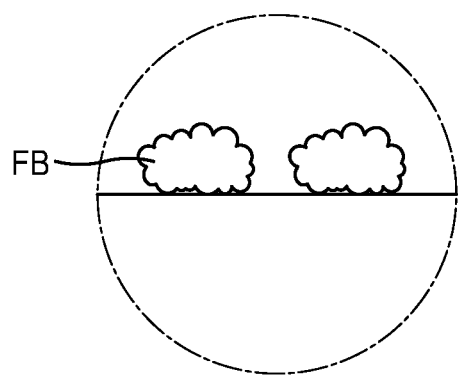
FIG. 7C is an enlarged view of region E in FIG. 7B.
Figure 7D:
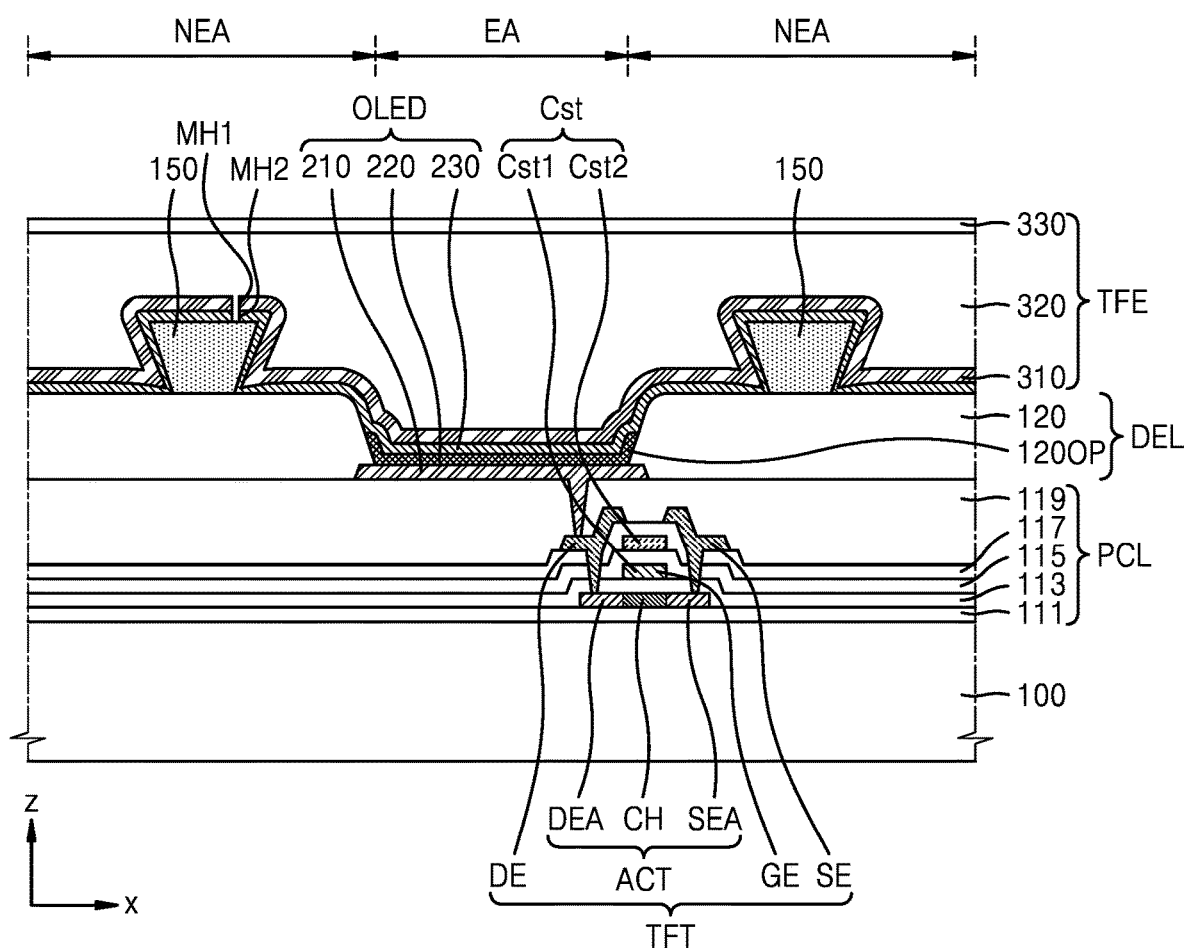

FIGS. 7A, 7B, and 7D are respectively cross-sectional views sequentially illustrating a method of manufacturing (or providing) a display apparatus 1 according to an embodiment. FIG. 7C is an enlarged cross-section of area E in FIG. 7B.

Referring to FIG. 7A, an emission layer 220 may be deposited in the first opening 120OP of the bank layer 120, after a protrusion portion 150 is formed spaced apart from the first opening 120OP. The emission layer 220 may be deposited through a mask process. In this case, in order to prevent a display element from being damaged due to the foreign substance of a mask FM or the stamp by the mask FM, the mask FM may be disposed on and supported by the top surface 150t (see FIG. 5) of the protrusion portion 150. In an embodiment, the mask FM may be a fine metal mask (FMM). The mask FM may include a mask opening FMOP, and the mask opening FMOP of the mask FM may be aligned to correspond to the first opening 120OP of the bank layer 120. The emission layer 220 may be formed by depositing an organic emission material through the mask opening FMOP of the mask FM.

Referring to FIG. 7B and FIG. 7C, the mask FM may be removed after the emission layer 220 is formed. As illustrated in FIG. 7C, a foreign substance FB due to the contact with the mask FM may remain on the top surface 150t of the protrusion portion 150 that has contacted the mask FM. At least a portion of the top surface 150t of the protrusion portion 150 may include an uneven surface due to the foreign substance FB remaining on the protrusion portion 150 or due to the damage to the top surface 150t of the protrusion portion 150 by the removal of the mask FM that has contacted the top surface 150t of the protrusion portion 150.

Referring to FIG. 7D, a second electrode 230 and a first inorganic encapsulation layer 310 may be formed on the protrusion portion 150. The second electrode 230 may be formed by using a sputtering process, a vacuum deposition process, a chemical vapor deposition process, a pulse laser deposition process, a printing process, or the like. In an embodiment, the second electrode 230 may be formed by thermal evaporation. When the second electrode 230 is formed by thermal evaporation, the straightness of a deposition material may increase under a high-vacuum condition and thus the thickness of the second electrode 230 may be affected by the shape or inclination of the deposition site.

A first functional layer and a second functional layer may be further formed on the protrusion portion 150 before the second electrode 230 is formed, and/or a capping layer may be further formed on the second electrode 230. The first functional layer, the second functional layer, and/or the capping layer may be formed in the same way as the second electrode 230. For example, in an embodiment, the first functional layer, the second functional layer, and/or the capping layer may be formed by thermal evaporation.

The first inorganic encapsulation layer 310 may be formed by, for example, a chemical vapor deposition process. Since the first inorganic encapsulation layer 310 has a relatively excellent step coverage unlike the second electrode 230, it may be continuously formed over the display layer DPL including the protrusion portion 150. For example, the first inorganic encapsulation layer 310 may be formed to have a generally uniform thickness on the top surface 150t and the side surface 150s (see FIG. 5) of the protrusion portion 150.

In the second electrode 230 and/or the first inorganic encapsulation layer 310, a defect such as a fine hole and a fine crack may be formed by the foreign substance FB or unevenness on the top surface 150t of the protrusion portion 150. A defective portion of the second electrode 230 and/or the first inorganic encapsulation layer 310 may be located on the top surface 150t of the protrusion portion 150. The defective portion of the second electrode 230 and/or the first inorganic encapsulation layer 310 may correspond to a portion having a smaller thickness or a lower density than other portions therearound. In this regard, FIG. 7D illustrates a first defective opening MH1 corresponding to a defective portion of the first inorganic encapsulation layer 310 and a second defective opening MH2 corresponding to a defective portion of the second electrode 230. In an embodiment, the first defective opening MH1 of the first inorganic encapsulation layer 310 and the second defective opening MH2 of the second electrode 230 may be a type of defect and may correspond to a fine hole or a fine crack. The first defective opening MH1 of the first inorganic encapsulation layer 310 may be formed on the top surface 150t of the protrusion portion 150 to overlap the top surface 150t of the protrusion portion 150 and expose the top surface 150t to outside the first inorganic encapsulation layer 310. Similarly, the second defective opening MH2 of the second electrode 230 may be formed on the top surface 150t of the protrusion portion 150 to overlap the top surface 150t of the protrusion portion 150 and expose the top surface 150t to outside the second electrode 230.

The first defective opening MH1 of the first inorganic encapsulation layer 310 and the second defective opening MH2 of the second electrode 230 may be disposed adjacent to each other on the protrusion portion 150 or may be disposed to overlap (or be aligned with) each other as illustrated in FIG. 7D.

As such, when there is a defective portion (e.g., a defect such as an opening, a fine hole, or a fine crack or a portion having a small thickness or a low density) of the first inorganic encapsulation layer 310 and/or the second electrode 230 disposed on the top surface 150t of the protrusion portion 150, a gas introduced from the inside or the outside may penetrate through the defective portion. For example, a gas included in the organic material included in the organic encapsulation layer 320 may be introduced into the second electrode 230 through the defective portion of the first inorganic encapsulation layer 310 and/or the second electrode 230. The gas may be a gas that causes oxidation by including moisture, oxygen, and the like.

The gas introduced through the defective portion of the first inorganic encapsulation layer 310 and/or the second electrode 230 may oxidize a portion of the second electrode 230 disposed on the top surface 150t of the protrusion portion 150 and may propagate along the side surface 150s of the protrusion portion 150 and then propagate toward the first opening 120OP of the bank layer 120, that is, the emission layer 220.

However, in one or more embodiment, as described above with reference to FIGS. 4 and 5, the protrusion portion 150 may include the protrusion portion 150 having a reverse-tapered shape in the cross-sectional view, and the thickness of a portion of the second electrode 230 disposed on the side surface 150s of the protrusion portion 150 may decrease toward the bottom surface 150b of the protrusion portion 150. Thus, even when the above gas is introduced into the second electrode 230, the gas may merely oxidize at least a portion of the second electrode 230 located on the side surface 150s of the protrusion portion 150 and the propagation of the oxidation toward the emission area EA may be prevented or minimized. Thus, the oxidation of the subpixel PX due to the gas introduction and the light emission defect thereof may be reduced.

Even when the above defect is caused, the oxidation of the second electrode 230 by the gas may only be locally caused around the protrusion portion 150, and the oxidation of the second electrode 230 on the emission area EA may be prevented. In embodiments, the oxygen concentration of a portion of the second electrode 230 covering the protrusion portion 150 may be greater than the oxygen concentration of a portion of the second electrode 230 overlapping the emission layer 220 in the emission area EA. In an embodiment, when the second electrode 230 includes magnesium (Mg), magnesium oxide (MgO) that is an oxide may be formed when the second electrode 230 is oxidized. For example, in the second electrode 230, the concentration of magnesium oxide in a portion covering the protrusion portion 150 may be greater than the concentration of magnesium oxide in a portion covering the emission layer 220.

Referring back to FIG. 7D, an organic encapsulation layer 320 and a second inorganic encapsulation layer 330 may be formed over the first inorganic encapsulation layer 310. In an embodiment, the organic encapsulation layer 320 may be formed by applying a monomer and then curing the same by using ultraviolet (UV) rays or the like. The second inorganic encapsulation layer 330 may be formed in the same way as the first inorganic encapsulation layer 310 described above.

In an embodiment, the second inorganic encapsulation layer 330 may be formed by chemical vapor deposition.

Figure 8:
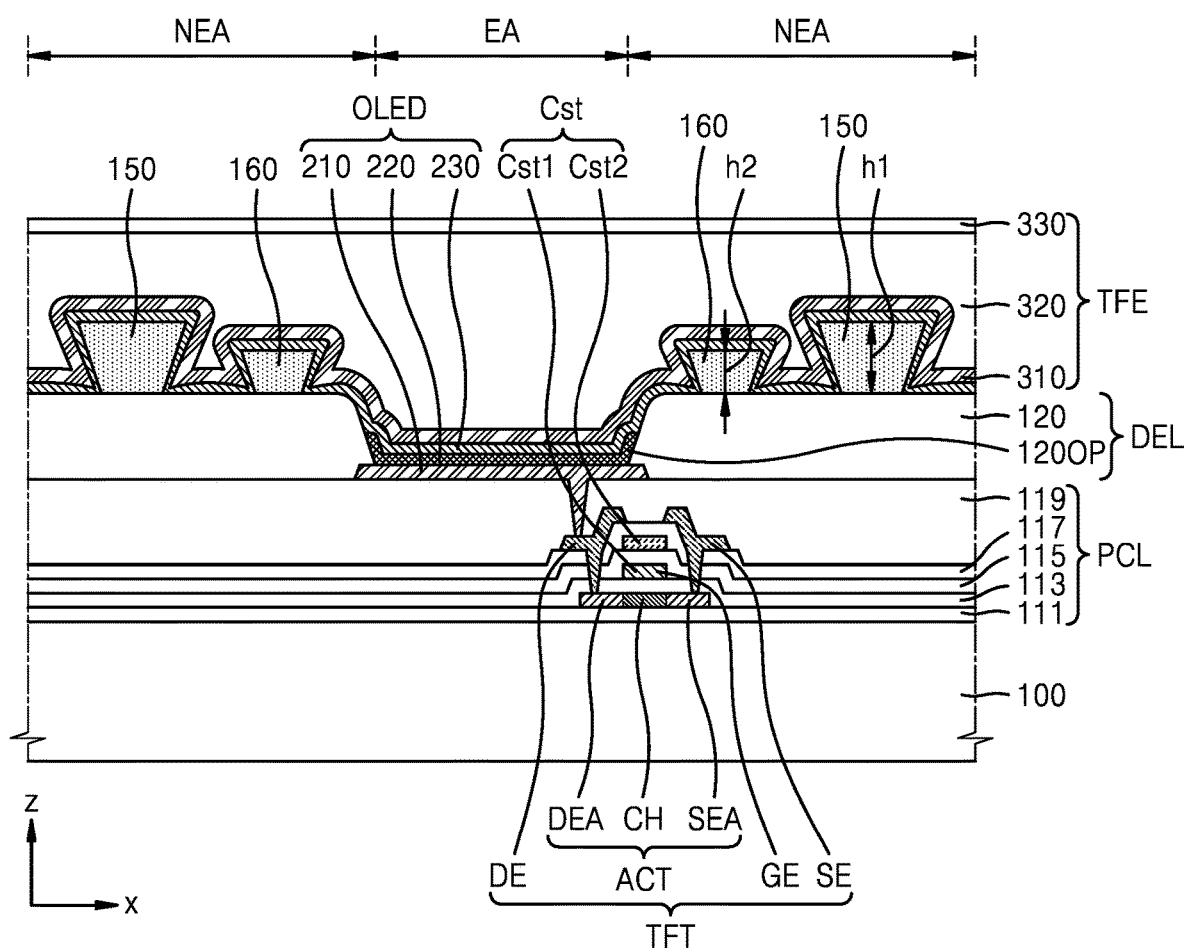
FIG. 8 is a cross-sectional view schematically illustrating a portion of a display apparatus according to an embodiment.
Figure 9:
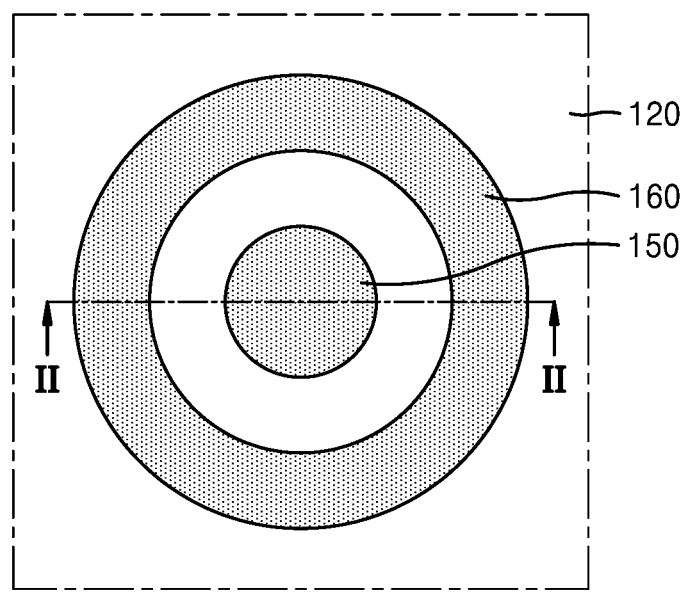
FIG. 9 is a plan view schematically illustrating a portion of a display apparatus according to an embodiment.
Figure 10:
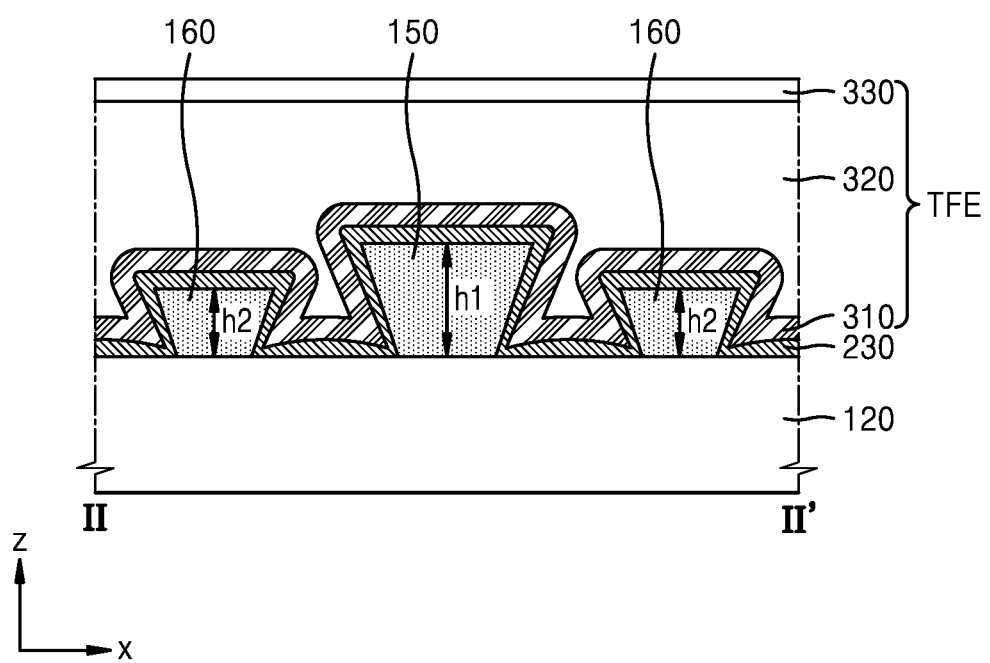
FIG. 10 is a cross-sectional view of the display apparatus taken along line II-II' of FIG. 9.

FIG. 8 is a cross-sectional view schematically illustrating a portion of a display apparatus 1 according to an embodiment, FIG. 9 is a plan view schematically illustrating a portion of a display apparatus 1 according to an embodiment, and FIG. 10 is a cross-sectional view of the display apparatus 1 taken along line II-II' of FIG. 9.

Referring to FIG. 8, the display apparatus 1 may further include a sub protrusion portion 160 arranged in the non-emission area NEA, on the bank layer 120. The sub protrusion portion 160 may be arranged spaced apart from the protrusion portion 150, in a direction along the bank layer 120. The sub protrusion portion 160 may have the same cross-sectional shape as the protrusion portion 150, and the structure of the second electrode 230 disposed on the side surface of the sub protrusion portion 160 may be substantially the same as the above-described structure of the second electrode 230 disposed along the protrusion portion 150.

A fifth thickness h2 of the sub protrusion portion 160 may be less than a fourth thickness h1 of the protrusion portion 150. In other words, a height from the top surface 120t of the bank layer 120 to the upper surface of the sub protrusion portion 160 which is furthest from the bank layer 120, may be less than a height from the top surface 120t of the bank layer 120 to the top surface 150t of the protrusion portion 150. During the mask process for forming the emission layer 220, the mask FM (see FIG. 7A) may not be deposited on the upper surface of the sub protrusion portion 160, and there may be no foreign substance FB or unevenness due to the mask FM.

The sub protrusion portion 160 may be disposed on the bank layer 120, and at least a portion of the sub protrusion portion 160 may be located between the protrusion portion 150 and the first opening 120OP of the bank layer 120 (or the emission area EA). The shortest distance in the horizontal direction (e.g., −x direction) from the end point of the first opening 120OP of the bank layer 120, for example, the third point P3, to a closest side surface of the sub protrusion portion 160, may be less than the shortest distance in the horizontal direction (e.g., −x direction) from the end point of the first opening 120OP of the bank layer 120, for example, the third point P3, to the closest side surface of the protrusion portion 150. That is, the sub protrusion portion 160 is closer to the emission area EA than the protrusion portion 150.

When the embodiment includes the sub protrusion portion 160, since the sub protrusion portion 160 is located between the first opening 120OP of the bank layer 120 and the protrusion portion 150, a total length of a path through which the oxidation generated at a portion of the second electrode 230 disposed over the protrusion portion 150 propagates to a portion of the second electrode 230 arranged in the first opening 120OP of the bank layer 120 may increase. Thus, the oxidation may not propagate to a portion of the second electrode 230 covering the emission layer 220 or may be minimized. The occurrence of a light emission defect due to subpixel oxidation may be further reduced.

Referring to FIGS. 9 and 10, the sub protrusion portion 160 may be formed to surround the protrusion portion 150 in the plan view. In an embodiment, the sub protrusion portion 160 may have a shape surrounding the protrusion portion 150 circularly in the plan view. The protrusion portion 150 may be concentric with the sub protrusion portion 160. However, the disclosure is not limited thereto, and in an embodiment, the sub protrusion portion 160 may have a shape surrounding the protrusion portion 150 tetragonally in the plan view. In an embodiment, the planar shape of the protrusion portion 150 may have a same center as the planar shape of the sub protrusion portion 160. In a plan view, the sub protrusion portion 160 has a closed shape which extends along an outer edge of the protrusion portion 150 and surrounds the second protrusion portion.

Referring to FIG. 10, when the sub protrusion portion 160 is formed to surround the protrusion portion 150 in the plan view, since the sub protrusion portion 160 is arranged on both of opposing sides of the protrusion portion 150 in the cross-sectional view, the oxidation generated at a portion of the second electrode 230 over the protrusion portion 150 may be prevented from propagating to portions of the second electrode 230 corresponding to the first openings 120OP of the bank layer 120 at the opposing sides of the protrusion portion 150. More particularly, the oxidation may be prevented from propagating to portions of the second electrode 230 corresponding to the first openings 120OP of the bank layer 120 which are adjacent to the protrusion portion 150 and the sub protrusion portion 160 in all directions along the plane (e.g., defined by the x direction and the y direction crossing each other). Thus, the occurrence of a light emission defect in the subpixel PX due to oxidation may be further reduced, and the dark point occurrence rate of the display apparatus 1 may be reduced and the luminance thereof may be improved.

As described above, since the display apparatus 1 according to one or more embodiment includes a protrusion portion 150 having a reverse-tapered shape in a cross-sectional view and since a thickness of a portion of a second electrode 230 disposed along a side surface 150s of the protrusion portion 150 decreases toward a bottom surface 150b of the protrusion portion 150, the light emission defect of a pixel, for example, the occurrence of a dark point, may be reduced. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a first electrode disposed on the substrate;
a bank layer overlapping an edge of the first electrode and defining an opening in the bank layer which corresponds to the first electrode;
a protrusion portion disposed on the bank layer and is spaced apart from the opening in the bank layer, the protrusion portion having a reverse-tapered structure in a cross-sectional view;
a point at which the bank layer meets the protrusion portion;
an emission layer overlapping the first electrode through the opening in the bank layer; and
a second electrode disposed on the emission layer and the protrusion portion,
wherein
a thickness of the second electrode decreases from a top surface of the protrusion portion toward a bottom surface of the protrusion portion on a side surface of the protrusion portion, and
the second electrode defines an opening adjacent to the point, the opening in the second electrode exposing a portion of the bank layer or the protrusion portion.

2. The display apparatus of claim 1, further comprising an encapsulation layer on the second electrode,
wherein the encapsulation layer includes a first inorganic encapsulation layer disposed on the second electrode, a second inorganic encapsulation layer disposed on the first inorganic encapsulation layer, and an organic encapsulation layer located between the first inorganic encapsulation layer and the second inorganic encapsulation layer.

3. The display apparatus of claim 2, wherein the first inorganic encapsulation layer defines an opening exposing the top surface of the protrusion portion.

4. The display apparatus of claim 1, wherein the opening in the second electrode exposes a bottom portion of the side surface of the protrusion portion.

5. The display apparatus of claim 1, wherein the opening in the second electrode exposes a portion of the top surface of the bank layer which is adjacent to a bottom portion of the side surface of the protrusion portion.

6. The display apparatus of claim 1, wherein within the second electrode, an oxygen concentration of a portion covering the protrusion portion is greater than an oxygen concentration of a portion covering the emission layer.

7. The display apparatus of claim 1, further comprising a sub protrusion portion disposed on the bank layer,
wherein the sub protrusion portion has a smaller thickness than the protrusion portion.

8. The display apparatus of claim 7, wherein at least a portion of the sub protrusion portion is located between the protrusion portion and the opening of the bank layer.

9. The display apparatus of claim 7, wherein in a plan view, the protrusion portion and the sub protrusion portion have a closed shape, and the sub protrusion portion surrounds the protrusion portion.

10. The display apparatus of claim 9, wherein the sub protrusion portion has a circular closed shape in the plan view.

11. An electronic apparatus comprising:
a display apparatus comprising:
a substrate;
a bank layer disposed on the substrate and defining a light emission area and a non-light emission area;
a light emitting device arranged in the emission area and including a first electrode, an emission layer on the first electrode, and a second electrode on the emission layer;
a protrusion portion arranged in the non-light emission area of the bank layer; and
a point at which the bank layer meets the protrusion portion,
wherein
the protrusion portion has a shape increasing in width away from the substrate,
the second electrode is disposed on the protrusion portion and defines an opening adjacent to the point, the opening exposing a portion of the bank layer or the protrusion portion, and a thickness of a portion of the second electrode disposed on a side surface of the protrusion portion decreases toward a bottom surface of the protrusion portion.

12. The electronic apparatus of claim 11, wherein the display apparatus further comprises an encapsulation layer which covers the light emitting device and the protrusion portion, wherein the encapsulation layer includes a first inorganic encapsulation layer disposed on the second electrode, a second inorganic encapsulation layer disposed on the first inorganic encapsulation layer, and an organic encapsulation layer located between the first inorganic encapsulation layer and the second inorganic encapsulation layer.

13. The electronic apparatus of claim 12, wherein the first inorganic encapsulation layer defines an opening exposing a top surface of the protrusion portion.

14. The electronic apparatus of claim 11, wherein the opening exposes a bottom portion of the side surface of the protrusion portion.

15. The electronic apparatus of claim 11, wherein the opening exposes the top surface of the bank layer which is adjacent to a bottom portion of the side surface of the protrusion portion.

16. The electronic apparatus of claim 11, wherein in the second electrode, an oxygen concentration of a portion covering the protrusion portion is greater than an oxygen concentration of a portion covering the emission layer.

17. The electronic apparatus of claim 11, wherein the display apparatus further comprises a sub protrusion portion disposed on the bank layer, wherein the sub protrusion portion has a smaller thickness than the protrusion portion.

18. The electronic apparatus of claim 17, wherein at least a portion of the sub protrusion portion is located between the protrusion portion and an opening of the bank layer.

19. The electronic apparatus of claim 17, wherein in a plan view, the protrusion portion and the sub protrusion portion have a closed shape, and the sub protrusion portion surrounds the protrusion portion.

20. The electronic apparatus of claim 19, wherein the sub protrusion portion has a circular closed shape in the plan view.

* * * * *